United States Patent [19]

Bouchard et al.

[11] 4,375,953
[45] Mar. 8, 1983

[54] MINIATURE PHOTOFLASH UNIT WITH ENCAPSULATED FLASH LAMPS

[75] Inventors: Andre C. Bouchard, Peabody; John A. Scholz, Danvers; Timothy Fohl, Carlisle, all of Mass.

[73] Assignee: GTE Products Corporation, Stamford, Conn.

[21] Appl. No.: 183,915

[22] Filed: Sep. 4, 1980

[51] Int. Cl.³ .............................................. F21K 5/02
[52] U.S. Cl. ...................... 431/359; 29/837; 362/13
[58] Field of Search .................. 431/357–359, 431/364; 362/13, 15, 11; 29/837, 838, 839, 840; 354/143, 127

[56] References Cited

U.S. PATENT DOCUMENTS

| | | | |
|---|---|---|---|
| 3,430,545 | 3/1969 | Wick | 362/13 |
| 3,473,880 | 10/1969 | Wick | 431/359 |
| 3,598,985 | 8/1971 | Harnden, Jr. | 362/11 |
| 3,608,451 | 9/1971 | Kelem | 354/143 |
| 3,612,850 | 10/1971 | Nyland | 362/10 |
| 3,857,667 | 10/1973 | Vetere et al. | 431/359 |
| 4,017,728 | 4/1977 | Audesse et al. | 362/13 |
| 4,087,233 | 5/1978 | Shaffer | 431/359 |
| 4,097,220 | 6/1978 | Coté et al. | 431/359 |
| 4,104,705 | 8/1978 | Levand, Jr. et al. | 431/359 |
| 4,113,424 | 9/1978 | Armstrong et al. | 362/13 |
| 4,136,379 | 1/1979 | Chevali | 362/13 |
| 4,164,007 | 8/1979 | Audene et al. | 362/13 |
| 4,238,814 | 12/1980 | Bricker et al. | 431/359 |
| 4,325,771 | 4/1982 | Brower et al. | 431/359 |

*Primary Examiner*—Samuel Scott
*Assistant Examiner*—Lee E. Barrett
*Attorney, Agent, or Firm*—Lawrence R. Fraley

[57] ABSTRACT

A miniature photoflash unit which is electrically activated when the unit is electrically connected to a power source (piezoelectric crystal) associated with many of today's pocket type cameras. The unit is capable of being positioned atop the camera and comprises a small planar housing, lamp-firing circuitry positioned externally of the housing, several (e.g., ten) subminiature flash lamps secured to the base and having lead-in wires passing through the base to effect electrical contact with the lamp-firing circuitry, a tabular mounting device is inserted within the camera to provide electrical connection between the circuitry and power source, and means for covering the externally located lamp-firing circuitry. The circuitry may be positioned either on an external surface of the housing or on a planar surface of the cover means which is attached to the housing.

37 Claims, 7 Drawing Figures

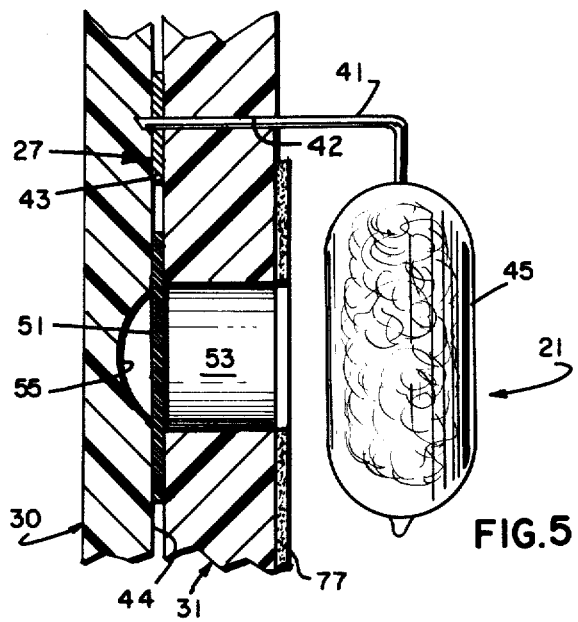
FIG. 5
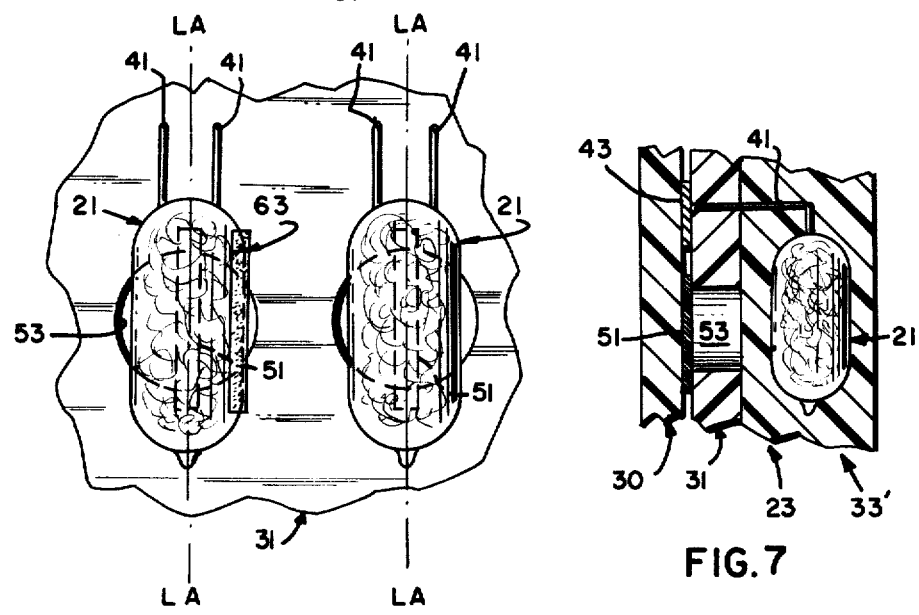
FIG. 6
FIG. 7

MINIATURE PHOTOFLASH UNIT WITH ENCAPSULATED FLASH LAMPS

DESCRIPTION

TECHNICAL FIELD

The invention relates to multilamp photoflash units and particularly to such units which are electrically activated. Even more particularly, the invention relates to units of the variety described which are capable of being attached to or inserted within many of today's cameras for being activated by the power source typically associated with such cameras.

BACKGROUND

The present invention represents a unique concept in the field of electrically-activated multilamp photoflash units. As will be described, the photoflash unit of the invention is capable of providing as many or more total flashes per unit as available from most products available today in a compact, miniaturized package possessing a total volume equal to only a fraction of such products. In addition, the invention is capable of operating with greater efficiency than existing units by providing significantly greater levels of lamp output per package volume allocated for each lamp than said currently sold products.

Typical examples of electrically-activated units on today's market are described and illustrated in U.S. Pat. Nos. 3,857,667 (Vetere et al), 4,017,728 (Audessee et al), and 4,164,007 (Audessee et al). The product illustrated in 3,857,667 is commonly referred to in the industry as a "flash bar" and includes two opposing linear arrays of electrically-activated lamps encased in a plastic housing. Subsequent to flashing of the lamps in one linear array, the device must be reversed and the remaining lamps then connected for firing. The "flash bars" available today typically possess a width (length) in excess of four inches, a height of about one and one-half inch, and a thickness (or depth) of about one-half inch. The unit in 4,017,728 is popularly referred to in the industry as a "flip-flash" and contains a total of eight high voltage flash lamps arranged in a vertically oriented planar array with connecting devices at opposite ends of the unit's plastic housing. The device must be inverted to assure ignition of all lamps therein. The "flip-flash" typically has an overall length in excess of five inches, a width in excess of one and one-half inch, and a thickness (depth) of about one-half inch. The multilamp unit described in 4,164,007 constitutes a more recent version of the "flip-flash" product, providing a total of ten lamps in a package possessing similar exterior dimensions to those above. This unit must also be inverted to achieve ignition of the entire array of lamps.

While it is known in the art that the above multilamp devices operate with a relatively high degree of reliability, it is understood that due to the relatively large size (total volume) of each device, carrying of several such units may prove somewhat cumbersome and inconvenient to the average photographer. In addition, the requirement that such devices be of the sizes mentioned above and heretofore deemed necessary in turn necessitates the utilization of correspondingly large quantities of material to produce same, thus adding to manufacturing costs thereof.

It is believed, therefore, that a multilamp photoflash unit which is extremely small in total external volume in comparison to existing such devices and also capable of providing at least an equal number of intense flashes per unit would constitute a significant advancement in the art.

It is also believed that such a unit which is capable of sequentially igniting all of the lamps therein without the need for inverting or reversing the unit, as heretofore required in prior art units such as those defined above, would constitute an art advancement. Several additional notably advantageous features provided by the instant invention over the present art, including the provision of significantly greater levels of lamp illumination per package volume allocated for each lamp, are described below and also deemed supportive of the contention that the invention represents a truly significant advancement in the current state of the art.

DISCLOSURE OF THE INVENTION

It is therefore a primary object of the present invention to provide a multilamp photoflash unit which is electrically-activated and possesses a total volume constituting only a fraction of the volume of the above-described multilamp units currently available today and yet is still able to provide at least an equal number of total flashes.

It is another object of the invention to provide such a unit wherein the lamp output per package volume allocated for each lamp is significantly greater than the above units, thus providing a unit which operates in a more efficient manner.

It is yet another object of the invention to provide such a unit wherein all of the unit's lamps are capable of being ignited in a sequential manner without the need for repositioning of the unit with respect to the camera with which it is to be utilized.

It is an even further object of the invention to provide a unit as described above which can be manufactured at significantly less cost than units available today.

In accordance with one aspect of the present invention, there is provided a minature photoflash unit which is capable of being electrically activated when connected to the power source typically associated with many of today's cameras. The unit comprises a small, substantially planar housing which includes an insulative base and a light-transmitting cover secured thereto or forming a part of the base, lamp-firing circuitry located on an external surface of the base, a plurality of subminiature flash lamps each including a pair of lead-in wires passing through the base and electrically connected to the circuitry, the lamps being located within the housing in a substantially planar array adjacent an internal surface of the base and arranged to occupy first and second separate regions within said array, means for covering the lamp-firing circuitry, and singular mounting device which electrically connects the unit to the camera's power source for providing the unit's circuitry with ignition pulses provided by the power source in order to effect selective ignition of the flash lamps in response to receipt of said pulses from the power source. The described lamp-firing circuitry is capable of selectively igniting all of the flash lamps in both of the described regions within the unit.

In accordance with another aspect of the present invention, there is provided a miniature photoflash unit capable of being electrically activated when connected to a power source associated with many of today's cameras, said unit including a small, substantially planar housing having an insulative base and light-transmitting cover an electrically insulative member which includes a planar surface thereon, said member secured to an external surface of the base, lamp-firing circuitry located on the planar surface of the insulative member, a plurality of subminiature electrically-activated flashlamps also secured to the base and located within the housing in a substantially planar array, each lamp including a light-transmitting envelope and a pair lead-in wires projecting therefrom, each of the wires passing on the planar surface of the insulative member, a plurality of subminiature electrically-activated flashlamps also secured to the base and located within the housing in a substantially planar array, each lamp including a light-transmitting envelope and a pair lead-in wires projecting therefrom, each of the wires passing through the base and being electrically connected to the lamp-firing circuitry located on the planar surface of the insulative member, and a singular mounting device for electrically connecting the photoflash unit to the camera's power source. The mounting device includes first and second conductive terminals located on a surface thereof and electrically joined to the unit's lamp-firing circuitry for supplying ignition pulses thereto in order to achieve selective ignition of the flash lamps located within the unit's housing.

BRIEF DESCRIPTION OF THE DRAWINGS

FIG. 5 is a partial, side elevational view, in section, of the unit of FIG. 4 in assembled form;

FIG. 6 illustrates a preferred means of preventing sympathetic ignition between two adjacent flash lamps in the invention; and FIG. 7 is a partial, side elevational view of the invention illustrating an alternate embodiment of a cover means for use therewith.

BEST MODE FOR CARRYING OUT THE INVENTION

For a better understanding of the present invention together with other and further objects, advantages and capabilities thereof, reference is made to the following disclosure and appended claims in connection with the above described drawings.

Figure 1:
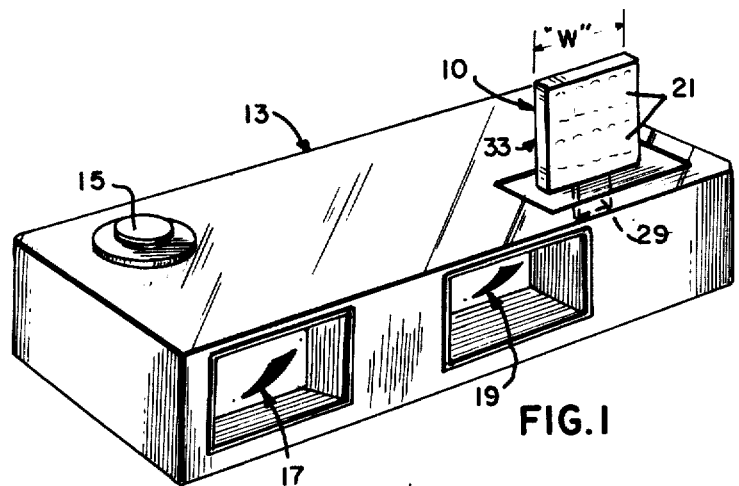
FIG. 1 is a perspective view of a miniature photoflash unit in accordance with the preferred teachings of the invention as positioned on a typical pocket-type camera available on the market today.

With particular reference to FIG. 1, there is shown a miniature photoflash unit 10 in accordance with a preferred embodiment of the invention, said unit being positioned atop a typical pocket camera 13 available on the market today. One example of such a camera is the "EKTRA 2", available from the Eastman Kodak Company, Rochester, N.Y. This camera possesses a shutter release button 15, a viewfinder 17, and a lens 19 arranged substantially in the manner illustrated in FIG. 1. In addition, pocket cameras of this type also include a socket (not shown) for accepting the aforementioned multilamp "flip-flash" units available today. Accordingly, the camera includes a power source therein for providing several high voltage, low energy pulses to the socket and thus to the connecting device of the photoflash unit inserted therein. One example of a power source typically associated with many of the cameras available today is the piezoelectric element or crystal which provides a pulse approaching about 3,000 volts upon mechanical actuation thereof. As will be described, unit 10 includes a tabular mounting device 29 which is capable of insertion within the afore described socket to assure connection of unit 10 to the described power source. With this mounting device inserted within the camera's socket, unit 10 will assume the position illustrated in FIG. 1.

As shown in FIG. 1, unit 10 is of a substantially planar configuration and includes a plurality of individual flash lamps 21 therein. As will be described below, each of these lamps is inverted with respect to the unit's tabular mounting device and therefore with respect to the camera itself. A total of ten lamps 21 is shown, with five of said lamps being arranged in a linear pattern above a correspondingly similar number also within a linear pattern immediately there below and parallel thereto. The unit is thus capable of providing a total of ten individual flashes of relatively high intensity in response to receipt of a similar number of the described high energy pulses from the camera's inboard power source. Further definition of the flash lamps 21 as used in unit 10 is provided below.

Figure 2:
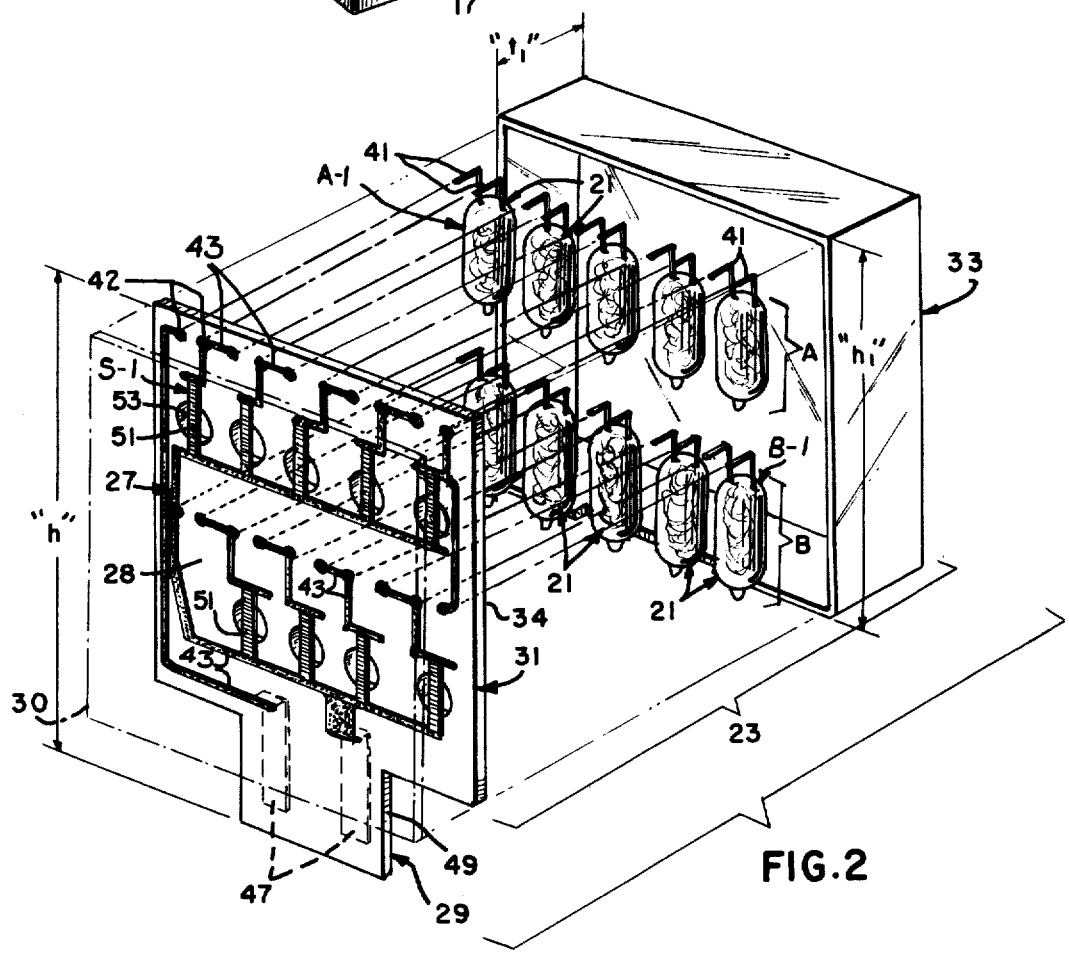
FIG. 2 is an enlarged, exploded perspective view of the photoflash unit of FIG. 1 illustrating the components as utilized therein and their respective positions within the unit.

In FIG. 2, there is provided an enlarged, exploded perspective view of the photoflash unit 10 shown in FIG. 1. Unit 10 comprises a small, two-piece substantially planar housing 23, lamp-firing circuitry 27 positioned on an external planar surface 28 of one part housing 23, the several subminiature, electrically-activated flash lamps 21 mentioned above, a tabular mounting device 29 secured to or forming a part of housing 23, and an electrically insulative cover means 30 (shown in phantom in FIG. 2) for covering the circuitry 27 located on surface 28. Housing 23 is of a very small, substantially planar configuration and includes a base member 31 (also planar) and a boxlike cover 33 which is secured to a front or internal surface 34 of base 31 to encase lamps 21 therein (see also FIG. 3). Base 31 and covers 30 and 33 are of electrically insulative material and are preferably comprised of a suitable plastic, e.g. polysyrene. Cover 33 is of course light-transmitting to permit passage of light from lamps 21 therethrough. As stated, housing 23 is extremely small in comparison to the housings typically associated with the aforedescribed "flip-flash" and "flash bar" photoflash devices. By way of specific example, the assembled unit 10 possessed an overall height (dimension "h" of FIGS. 2 and 4) of only about 1.50 inch, a width (dimension "w" in FIG. 1) of only about 1.00 inch, and a thickness or depth (dimension "t" in FIG. 3) of less than 0.375 inch. Boxlike cover 33, which is attached (e.g., using a suitable epoxy) to base 31 (e.g., to the forward, internal surface 34), possesses an overall width of 1.00 inch and a height (dimension "$h_1$", in FIG. 2) of 1.00 inch. The thickness (dimension "$t_1$" in FIG. 2) of cover 33 is about 0.250 inch. Base 31, excluding the tab portion 29 which extends therefrom, possesses a width and height identical to those of cover 33 and has a thickness of only about 0.06 inch. Planar cover 30 is also approximately 1.00 inch wide by 1.00 inch high, with a thickness of only 0.06 inch. The completely assembled unit depicted in FIG. 2 possesses a total package volume of only about 0.25 to about 0.38 cubic inches.

Located on the back or external surface 28 of base 31 is the unit's lamp-firing circuitry 27 which functions to selectively fire (ignite) each lamp 21. By the term external is meant a surface not located within the confines of the two-piece housing 23 itself (that portion occupied by lamps 21). It is understood that this surface, having circuitry 27 thereon is to eventually be covered by planar cover 30 in the final embodiment of the invention. Accordingly, the terms internal and external when describing the invention are used in this context.

Figure 3:
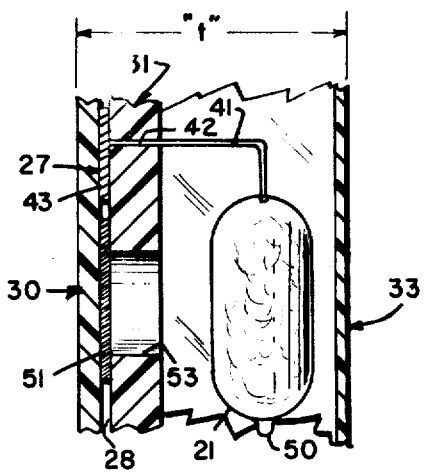
FIG. 3 is a partial, side elevational view, in section, of the unit of FIG. 2 in assembled form.
Figure 4:
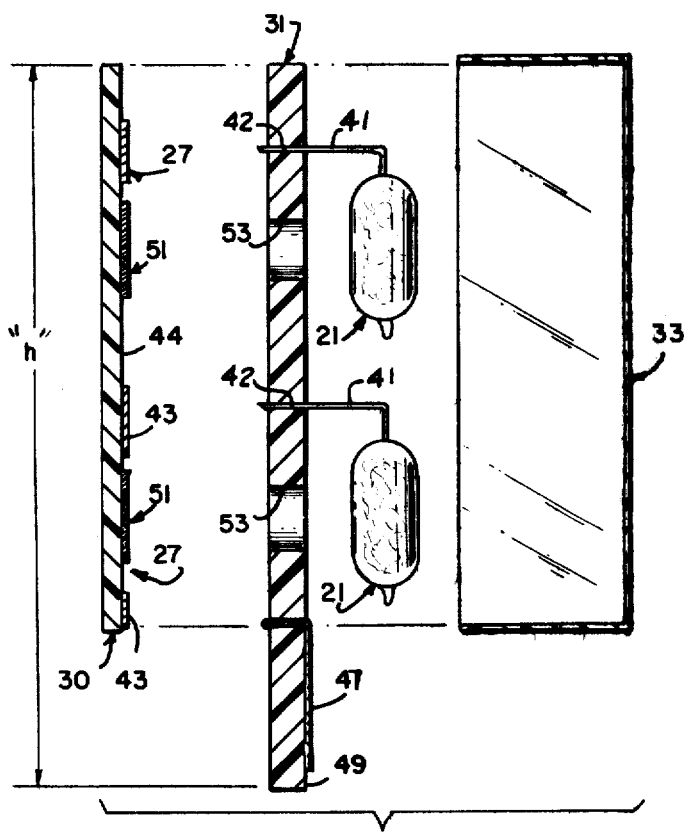
FIG. 4 is an exploded side elevational view, in section, of a miniature photoflash unit in accordance with an alternate embodiment of the invention.

In the embodiment of the invention as depicted in FIGS. 2 and 3, lamp-firing circuitry 27 is preferably applied to the back surface 28 of base 31 using a silk-screening procedure. Such a procedure is known in the art for providing conductive circuit paths on insulative substrates and further definition is thus not deemed necessary. With particular regard to FIG. 3, unit 10 is assembled such that each of the lead-in wires 41 of each lamp are inserted within a respective opening 42 provided within the insulative base 31. The wires are inserted such that the terminations or extreme ends thereof lie flush with the back surface 28 of base 31. In this secured position, the lamp-firing circuitry is then silk-screened in the pattern depicted in FIG. 2 such that the designated portions of the conductive runs 43 of circuitry 27 physically contact and are therefore electrically connected to the lead-in wire terminations. In accordance with the embodiment of the invention depicted in FIGS. 4 and 5, the lamp-firing circuitry 27 is applied to a planar surface 44 of the of the cover 30 rather than on the afore-described external surface of base 31. The circuitry may be applied utilizing the above-mentioned silk-screening operation or may also be applied utilizing a die stamping procedure. Die-stamping is preferred to positively assure high resolution (precisioned alignment in a close pattern) of the circuit runs. If die-stamping is used, each circuit run is preferably of aluminum or a similar metallic material specifically adapted for die-stamping. In the event that circuitry 27 is silk-screened, the material for each circuit run would be comprised of a composition of silver-coated glass beads in a polystyrene binder. With the circuit 27 positioned on the planar surface 44 of back cover 30, contact between the circuit and the lead-in wires 41 of each lamp is accomplished by extending sharpened terminations of each wire beyond the back surface 28 of base 31 in the manner depicted in FIG. 4. These sharpened ends will thus penetrate or pierce the designated locations of circuitry 27 when the back cover 30 is secured (e.g., using a pressing technique) to base 31. As in the case of the lead-in wires 41 in FIG. 3, each of the lead-in wires of the embodiment of the invention shown in FIGS. 4 and 5 are securedly positioned within corresponding openings 42 in base 31 prior to the above final assembly. As shown, each flash lamp 21 includes a glass envelope 45 from which the described lead-in wires project. Further definition of the lamps used in the invention is provided below.

The lamps of the invention are electrically connected in a series arrangement such that those in the upper or first region (A) are flashed first and those in the lower region (B) fired thereafter. As illustrated, each of the lamps is positioned in an inverted manner with respect to the tabular device 29. In operation, when the tabular device 29 is inserted within the respective socket of camera 13, the aforedefined high voltage pulses are applied to a pair of conductive terminals 47 located on a front surface 49 of tab 29. Terminals 47 are electrically connected to circuitry 27 through openings provided in base 31 and thus supply the circuit with said pulses. Accordingly, terminals 47 are located on an opposing surface from circuitry 27. Terminals may be die-stamped or silk-screened on surface 49 in much the same manner as circuitry 27. Lamps 21, being joined in series, are understandably ignited in a sequential manner. That is, in the parallel linear patterns illustrated in FIG. 2 for each of the described regions A and B, the lamp to the upper left (A-1) in region A is fired first. Thereafter, the lamp immediately adjacent thereto (to the right of A-1 in FIG. 2) is then ignited and so on. After all of the lamps in region A are flashed, the lamps in region B are then sequentially ignited. With the circuit arrangement depicted in FIG. 2, the first lamp (B-1) in region B to be fired will be that lamp located to the lower right (or immediately below the last lamp fired in region A). Thereafter, the lamp immediately adjacent thereto (to the left of B-1 in FIG. 2) will be fired and so on. Further definition of the mode of operation is provided below.

Subsequent to ignition thereof, each lamp is designed to provide a circuit path of relatively low resistance thereacross such that subsequently applied pulses may pass therethrough to effect ignition of the next, adjoining lamp. This is accomplished by providing a primer material (not shown) within the lamp which bridges the inwardly projecting ends of the lamp's lead-in wires 41 prior to lamp ignition and leaves a low resistance residue subsequent to said ignition. A suitable primer material for this purpose may comprise a mixture of a powdered metal, oxidizer, and oxides. For example, a mixture of zirconium powder, alkaline earth metal chlorates, barium chromate, and lead oxide can be used. Using such materials, the remaining residue typically possessed an average low resistance of only about 100 to about 10,000 ohms after ignition. A more specific example of a primer is defined in U.S. Pat. No. 4,128,858 (Sterling et al).

In addition to the aforementioned primer materials and projecting lead-in wires, each lamp 21 of the invention includes the above-mentioned, light-transmitting glass envelope 45 having therein a quantity of a shredded combustible material such as zirconium or hafnium and a suitable combustion supporting atmosphere such as oxygen. In the inverted form, it is understood that the shredded combustible material will form a molten pool in the inverted tip end 50 (FIG. 3) subsequent to ignition while the described primer will serve to bridge the projecting inner ends of wires 41. Each lamp 21, as stated, is capable of being ignited by the high voltage pulse provided by the described piezoelectric element, which in turn provides a pulse approaching 3,000 volts upon mechanical actuation (e.g., impact) thereof. In each of the lamps of the invention, a total of from about 3.0 to about 6.0 milligrams of shredded combustible was utilized. In addition, the internal envelope pressure of the combustion supporting oxygen was established within the range of about 10 to about 15 atmospheres. Each of the lamp's lead-in wires 41 was bent at approximately 90 degrees prior to positioning within base 31. The preferred glass for envelopes 45 is a soft glass, several varieties of which are known in the art. One particular example is a potash soda lead glass sold by the assignee of the invention under the product designation SG 10. Each of the lead-in wires is preferably comprised of a nickle-iron alloy, one preferred example sold under the tradename Niron.

Each of the above lamps is defined as being subminiature; that is, each possesses an internal volume (of the envelope) within the range of only about 0.02 cubic centimeters to about 0.08 cubic centimeters. Using the above quantities of combustible and corresponding internal pressures, each of these extremely small lamps was capable of providing a total output of between 800 and 1600 lumen-seconds, or approximately from 18 to 36 percent of the output (typically 4500 lumen-seconds) provided by the lamps utilized in today's "flip-flash" products. This singular output level is more than adequate to satisfy the requirements of many of today's higher speed (e.g., ASA 400) films. Dimensionwise, the glass envelopes of the lamps as described each had an overall length of only about 0.5 inch long and an outside diameter within the range of about 0.165 inch to about 0.180 inch. The preferred wall thickness for each envelope was only about 0.025 inch. It is understood with regard to the invention that the described outputs for each lamp can also be increased by the addition of a suitable reflecting coating (described below) or individual reflector members.

The invention, as stated above, is capable of operating with substantially greater efficiency than the aforedescribed known multilamp units, as well as many other of the percussive variety. By the term efficiency with regard to the products described herein is meant the individual lamp output (in lumen-seconds) per total package volume allocated for each lamp. The earlier 8-lamp "flip-flash" devices were capable of producing about 4500 lumen-seconds per flash from a package possessing a total volume of about 3.84 cubic inches. Accordingly, the volume allocated in the package for each lamp was only about 0.480 cubic inches. The unit's efficiency was therefore only about 9375 lumen-seconds per allocated lamp volume for the 8-lamp device. The described 10-lamp "flip-flash" units, each producing 4500 lumen-seconds in a package of similar dimension (3.84 cubic inches), possess an efficiency of only about 11,718 lumen-seconds per volume allocated for each lamp. The aforementioned 10-lamp "flash bar" units possess a total package volume of about 2.94 cubic inches with each lamp providing an extremely high output of 8000 lumen-seconds. The result is a lamp output of about 27,000 lumen-seconds per allocated lamp volume in the package.

In striking comparison, the total package volume of the instant invention is only about 0.25 to about 0.38 cubic inches, with each of the ten closely spaced subminiature lamps producing from about 800 to 1600 lumen-seconds. Thus, a total of only about 0.025 to about 0.38 cubic inches is provided for each lamp. For those lamps providing the lesser output (800 lumen-seconds), the range of efficiency for the invention was from about 21,000 to about 32,000 lumen-seconds per allocated lamp volume per package while efficiencies for the 1600 lumen-second units ranged a remarkably high 42,100 to 64,000 lumen-seconds per allocated lamp volume per package. Utilizing the unique teachings defined herein, the invention is therefore able to provide a package efficiency more than double that of today's currently available electrically-activated photoflash units.

By way of further example, the earlier known percussively-activated multilamp units still sold today under the tradename "Magicube" possessed efficiencies of only about 7200 lumen-seconds per allocated lamp volume per package. The typical "Magicube" product contains only four lamps in a boxlike, transparent housing having a total volume of about 2.49 cubic inches. Each lamp, like those of the "flip-flash" variety, provides an output reaching 4500 lumen-seconds.

Circuitry 27 is shown in FIG. 2 as including a plurality of radiant energy-activated disconnect switches 51, each being located adjacent a respective one of the flash lamps 21, excluding not necessarily the last lamp to be fired (for reasons explained below). For example, in FIG. 2, the first switch (S-1) is located adjacent lamp A-1. Each switch provides a complete circuit to the connecting devices grounding terminal during application of the respective ignition pulse to the lamp being fired and is designed for assuring an open circuit subsequent to lamp ignition. Specifically, each switch 51 upon receiving the high intensity radiant energy from the ignited lamp immediately adjacent thereto shrinks to the point where it physically separates at its approximate center. It can thus be seen that a subsequent pulse, when applied to terminals 47, will reach the next adjoining lamp to be fired. Accordingly, it is not necessary that the last lamp in the planar array have one of the described switches 51 positioned adjacent thereto. Each switch 51 comprises a thin, longitudinal strip of plastic preferably fabricated from mono- or biaxially-oriented polyethylene, polypropylene, polystyrene, polyester or nylon. A preferred material is Mylar. The polymeric material itself may be rendered electrically conductive by additives such as carbons or may be rendered surface conductive by provision of a suitable conductive layer thereon. Such a layer may be attained by a vacuum metalization process, electrolysis plating, printing, or a similar coating technique. The piece of switch material may be self-adhesive, such as a tape, and pressure applied to attach both ends of the strip to either the external surface 28 (FIG. 2) or to the planar surface 44 (FIG. 4) in the manner illustrated. In the embodiment shown in FIGS. 2 and 3, each strip is located so that it bridges a respective aperture 53 located within base 31 adjacent each respective lamp 21. Receipt of radiant energy from the respective flash lamp (through aperture 53) causes a separation near the center of each strip with the two severed ends shrinking back away from each other so as to give the described open circuit which will reliably withstand several thousand volts without leakage. In the embodiment of FIGS. 4 and 5, each switch 51 is located on surface 44 such that it will be aligned with a respective opening 53 provided in base 31 when the unit is completely assembled (FIG. 5). The aforedescribed separation of each switch upon receipt of the intense energy from lamp 21 was facilitated by providing a depression or indentation 55 within the planar surface 44 of cover 30 immediately adjacent (beneath) each switch. It is also within the scope of the invention to provide an aperture (not shown) within cover 30 similar to aperture 53 in base 31 to provide a means of indicating to the unit user when the respective lamp has been fired, should such indication be desired. It is also within the scope of the invention to arrange the lamps 21 in parallel, using suitable sequencing means. For example, each lamp (excluding the last to be fired) can be connected to one of the aforedescribed disconnect switches 51 and in addition to a radiant energy activated connect switch of the type described in U.S. Pat. No. 4,017,728 (Audesse et al) in much the same manner as the circuit disclosed in this patent. Disconnect switches of this variety typically include silver oxide dispersed in a suitable binder (e.g. polyvinyl resin) and are each designed to exhibit a closed circuit or low resistance between its switch terminals after receiving energy from a respective adjacent lamp in the form of light and/or heat. Originally, the switch possesses a very high resistance approaching an open circuit. The firing order for lamps 21, should this type of circuit be employed, would preferably be the same as that for the embodiment of the invention depicted in FIG. 2. In view of the above, the teachings of 4,017,728 are incorporated herein by reference.

In FIG. 6, there is illustrated in greater detail the preferred positioning relationship between the described disconnect switches 51 and adjacently positioned lamps 21. As shown, each lamp is arranged such that its longitudinal axis LA—LA lies parallel to the longitudinal axis (not shown) of the elongated Mylar longitudinal strip 51. This arrangement provides for both the described activation of each strip by the respective flash lamp as well as assuring minimum spacing between lamps and circuit components, an understandably essential requirement to assure the described features of compactness and miniaturization. For example, the lamps of the units in FIGS. 2 and 4 were spaced apart a distance of only about 0.002 inch. In FIG. 6 there is also illustrated the means for preventing sympathetic ignition between adjacent lamps. Sympathetic ignition is known to occur in flash lamps which are positioned too close together. In summary, the lamp being fired will emit sufficient radiant energy so as to cause subsequent ignition of the adjacent lamp. This phenomena is well known in the flash lamp art and further description is not believed necessary. To prevent this occurrence, a strip or coating 63 of opaque material is positioned on one side of each lamp so as to substantially prevent emission of the described radiant energy in the direction of the adjacent lamp. It is understood that only the first four lamps to be fired in each region need be provided described strip 63 of opaque material, said strip being positioned between the lamp to-be-fired and the immediately adjacent unfired lamp. A preferred opaque material for strip 63 is an adhesive-backed aluminum foil.

Yet another acceptable means for preventing sympathetic ignition would be to provide a plurality of opaque shielding members attached to the front surface 34 of base 31 and located between adjacent lamps. Such materials could be comprised of plastic (e.g., polystyrene) covered with a suitable coating of the described material.

To enhance emission of the radiant energy provided by each of the lamps 21, it is preferred to provide a coating of reflective material (e.g., white paint) on the portions of the forward surface 34 of base 31 not containing the described apertures 53. Such a coating is illustrated in FIG. 5 by the numeral 77. It is also within the scope of the invention to provide individual reflective components (e.g., formed plastic members coated with a suitable reflective coating such as aluminum) within housing 23 and adjacent each respective lamp 21. Such reflective members would necessarily include apertures therein to permit passage of energy from each lamp to the respective disconnect switches 51. It is even further within the scope of the invention to include within base 31 a white or similar pigment material (e.g., titanium dioxide) to provide this feature.

In the embodiment depicted in FIG. 7, the unit's light-transmitting cover means 33' is illustrated as substantially encapsulating the respective flash lamps 21 located within the two-piece housing 23. Cover means 33' is preferably comprised of one of the afore mentioned insulative materials and may be molded about each lamp when completing final assembly of unit 10. It is also within the scope of the invention to provide suitable recesses within the substantially solid cover 33' and position the respective flash lamps 21 therein such that the lamps projecting lead-in wires 41 will extend above the surface of the cover the necessary distance. Should a totally encapsulating material be utilized for light-transmitting cover 33', it is preferred that the cover have an overall depth or thickness substantially similar to that of the covers 33 as described above.

While there have been shown and described what are at present considered the preferred embodiments of the invention, it will be obvious to those skilled in the art that various changes and modifications may be made therein without departing from the scope of the invention as defined by the appended claims.

What is claimed is:

1. A miniature photoflash unit for being electrically activated when electrically connected to a power source associated with a camera, said photoflash unit comprising:

a small, substantially planar housing including an electrically insulative base and light-transmitting cover means secured to or forming a part of said base;

lamp-firing circuitry located on an external surface of said base;

a plurality of subminiature, electrically-activated flash lamps secured to said base and located within said housing in a substantially planar array adjacent an internal surface of said base, each of said flash lamps including a light-transmitting envelope and a pair of lead-in wires projecting therefrom, each of said lead-in wires including an end portion which passes through said base and lies substantially flush with said external surface of said base, said end portions being directly electrically connected to said lamp-firing circuitry located on said external surface, said flash lamps occupying first and second separate regions within said housing, said lamp-firing circuitry selectively igniting said flash lamps in both of said regions, said circuitry not including a metal eyelet or the like as part thereof;

means for substantially covering said lamp-firing circuitry on said external surface of said base; and a singular mounting device secured to said housing or forming a part thereof for electrically connecting said photoflash unit to said power source associated with said camera when said mounting device is connected to said power source, said device including first and second conductive terminals positioned on a surface of said device and electrically joined to said lamp-firing circuitry for supplying ignition pulses to said circuitry to effect said selective ignition of said flash lamps in response to receipt of said pulses from said power source.

2. The photoflash unit according to claim 1 wherein the flash lamps in each of said first and second regions are oriented in a linear pattern, said linear patterns being substantially parallel.

3. The photoflash unit according to claim 1 wherein all of said flash lamps are electrically joined in a series relationship, said lamps in said first region being activated prior to said lamps in said second region.

4. The photoflash unit according to claim 3 wherein each of said flash lamps in each of said first and second regions is oriented in an inverted position with respect to said tabular mounting device.

5. The photoflash unit according to claim 4 wherein each of said flash lamps possesses a relatively low resistance subsequent to ignition thereof.

6. The photoflash unit according to claim 3 wherein said base includes a plurality of apertures therein, each of said apertures positioned adjacent a respective one of said flash lamps excluding not necessarily the last flash lamp to be ignited, and said lamp-firing circuitry includes a plurality of radiant energy-activated disconnect switches, each of said switches positioned across a respective one of said apertures within said base for providing an open circuit thereacross upon receipt of radiant energy from said flash lamp, said energy passing through said aperture.

7. The photoflash unit according to claim 6 wherein each of said disconnect switches comprises a longitudinal strip, the longitudinal axis of each of said strips being parallel to the longitudinal axis of each respective flash lamp.

8. The photoflash unit according to claim 6 wherein the conductive paths of said lamp-firing circuitry are silk-screened on said external surface of said base.

9. The photoflash unit according to claim 8 wherein the portions of said lamp-firing circuitry directly electrically connected to said end portions of said lead-in wires are silk-screened over and in contact with said end portions to provide said direct electrical connection.

10. The photoflash unit according to claim 1 wherein said mounting device is a tabular member secured to or forming a part of said base of said housing.

11. The photoflash unit according to claim 1 wherein the number of flash lamps in each of said first and second separate region is five.

12. The photoflash unit according to claim 1 further including means to prevent sympathetic ignition of adjacent flash lamps.

13. The photoflash unit according to claim 12 wherein said means to prevent sympathetic ignition comprises a strip or coating of opaque material located on one side of each of said flash lamps excluding not necessarily the last flash lamp in each of said separate regions to be ignited.

14. The photoflash unit according to claim 1 further including means for reflecting portions of the light emitted by each of said flash lamps upon ignition thereof toward said light-transmitting cover.

15. The photoflash unit according to claim 14 wherein said reflecting means comprises a reflective coating located on said internal surface of said base adjacent each of said flash lamps.

16. The photoflash unit according to claim 1 wherein said means for covering said lamp-firing circuitry on said external surface of said base comprises a thin member of electrically insulative material secured to said external surface.

17. The photoflash unit according to claim 1 wherein said light-transmitting cover means comprises a quantity of electrically insulative material, said material substantially encapsulating each of said flash lamps.

18. The photoflash unit according to claim 1 wherein the lamp output per unit volume allocated per lamp is within the range of about 21,000 to about 64,000 lumen-seconds.

19. The photoflash unit according to claim 6 wherein said means for covering said lamp-firing circuitry on said external surface of said base includes an indentation therein beneath each of said radiant energy activated disconnect switches to facilitate separation of each of said switches upon receipt of radiant energy from a respective one of said flash lamps.

20. A miniature photoflash unit for being electrically activated when electrically connected to a power source associated with a camera, said photoflash unit comprising;
a small substantially planar housing including an electrically insulative base and light-transmitting cover means secured to or forming part of said base;
an electrically insulative cover member including a substantially planar surface, said insulative cover member secured to an external surface of said base;
lamp-firing circuitry located on said substantially planar surface of said insulative cover member, said circuitry not including a metal eyelet or the like as part thereof;
a plurality of subminiature electrically-activated flash lamps secured to said base and located within said housing in a substantially planar array adjacent an internal surface of said base, each of said flash lamps including a light-transmitting envelope and a pair of lead-in wires projecting therefrom, each of said lead-in wires including an end portion which passes through said base and penetrates said lamp-firing circuitry on said insulative cover member to be directly electrically connected to said lamp-firing circuitry, said flash lamps occupying first and second separate regions within said housing, said lamp-firing circuitry selectively igniting said flash lamps in both of said regions; and
a singular mounting device for electrically connecting said photoflash unit to said power source associated with said camera when said mounting device is connected to said power source, said device including first and second conductive terminals positioned on a surface thereof and electrically joined to said lamp-firing circuitry on said insulative member for supplying ignition pulses to said circuitry to effect said selective ignition of said flash lamps in response to receipt of said pulses from said power source.

21. The photoflash unit according to claim 19 wherein said mounting device is a tabular member secured to or forming a part of said base of said housing.

22. The photoflash unit according to claim 20 wherein the flash lamps in each of said first and second regions are oriented in a linear pattern, said linear patterns being substantially parallel.

23. The photoflash unit according to claim 19 wherein all of said flash lamps are electrically joined in a series relationship, said lamps in said first region being activated prior to said lamps in said second region.

24. The photoflash unit according to claim 23 wherein each of said flash lamps in each of said first and second regions is oriented in an inverted position with respect to said tabular mounting device.

25. The photoflash unit according to claim 24 wherein each of said flash lamps possesses a relatively low resistance subsequent to ignition thereof.

26. The photoflash unit according to claim 23 wherein said base includes a plurality of apertures therein, each of said apertures positioned adjacent a respective one of said flash lamps excluding not necessarily the last flash lamp to be ignited, and said lamp-firing circuitry includes a plurality of radiant energy-activated disconnect switches, each of said switches positioned on said insulative member relative to a respective one of said apertures within said base for providing an open circuit thereacross upon receipt of radiant energy from said flash lamp, said energy passing through said aperture.

27. The photoflash unit according to claim 26 wherein each of said disconnect switches comprises a longitudinal strip, the longitudinal axis of each of said strips being parallel to the longitudinal axis of each respective flash lamp.

28. The photoflash unit according to claim 26 wherein the conductive paths of said lamp-firing circuitry are silk-screened on said planar surface of said insulative member.

29. The photoflash unit according to claim 26 wherein the conductive paths of said lamp-firing circuitry are die-stamped on said planar surface of said insulative member.

30. The photoflash unit according to claim 20 wherein the number of flash lamps in each of said first and second separate regions is five.

31. The photoflash unit according to claim 20 further including means to prevent sympathetic ignition of adjacent flash lamps.

32. The photoflash unit according to claim 31 wherein said means to prevent sympathetic ignition comprises a strip or coating of opaque material located on one side of each of said flash lamps excluding not necessarily the last flash lamp in each of said separate regions to be ignited.

33. The photoflash unit according to claim 20 further including means for reflecting portions of the light emitted by each of said flash lamps upon ignition thereof toward said light-transmitting cover.

34. The photoflash unit according to claim 33 wherein said reflecting means comprises a reflective coating located on said internal surface of said base adjacent each of said flash lamps.

35. The photoflash unit according to claim 20 wherein said light-transmitting cover means a comprises a quantity of electrically insulative material, said material substantially encapsulating each of said flash lamps.

36. The photoflash unit according to claim 20 wherein the lamp output per unit volume allocated per lamp is within the range of about 21,000 to about 64,000 lumen-seconds.

37. The photoflash unit according to claim 26 wherein said insulative cover member secured to said external surface of said base includes an indentation therein beneath each of said radiant energy activated disconnect switches to facilitate separation of each of said switches upon receipt of radiant energy from a respective one of said flash lamps.

* * * * *